(12) United States Patent
Cheng

(10) Patent No.: US 6,972,463 B2
(45) Date of Patent: Dec. 6, 2005

(54) MULTI-FINGER TRANSISTOR

(75) Inventor: Jyh-Nan Cheng, Ilan (TW)

(73) Assignee: United Microelectronics Corp., Hsinchu (TW)

( * ) Notice: Subject to any disclaimer, the term of this patent is extended or adjusted under 35 U.S.C. 154(b) by 58 days.

(21) Appl. No.: 10/690,463

(22) Filed: Oct. 20, 2003

(65) Prior Publication Data

US 2005/0082620 A1   Apr. 21, 2005

(51) Int. Cl.[7] .............................................. H01L 29/94

(52) U.S. Cl. ..................... 257/365; 257/173; 257/341; 257/344; 257/355; 257/408

(58) Field of Search ................................ 257/173, 340, 257/341, 342, 343, 344, 355, 365, 408

(56) References Cited

U.S. PATENT DOCUMENTS

| 6,576,965 B2 * | 6/2003 | Eikyu et al. ................ 257/408 |
| 2003/0155600 A1 * | 8/2003 | Shiau et al. ................ 257/297 |

* cited by examiner

Primary Examiner—Minhloan Tran
Assistant Examiner—Tan Tran
(74) Attorney, Agent, or Firm—J. C. Patents

(57) ABSTRACT

A multi-finger transistor is described, including multiple parallel transistors. Each transistor includes a gate dielectric layer, a gate, a source/drain region, and a drift region in the peripheral substrate of the source/drain region separating the source/drain region and the channel region under the gate. The width of the drift region extending from the side boundary of the source/drain region increases stepwise from the edge sections of the multi-finger transistor toward the central section of the same.

13 Claims, 4 Drawing Sheets

MULTI-FINGER TRANSISTOR

BACKGROUND OF THE INVENTION

1. Field of the Invention

The present invention relates to a structure of a semiconductor device. More particularly, the present invention relates to a structure of a multi-finger transistor that is suitably used as an electrostatic discharge (ESD) protection device.

2. Description of the Related Art

In accompany with continuous reduction in dimensions, IC devices, especially the gate oxide layers therein, ate more and more easily damaged by ESD. Therefore, additional ESD protection devices are usually designed in integrated circuits. One type of ESD protection device is the multi-finger transistor, which is usually constituted of multiple NMOS transistors.

FIGS. 1(A), (B) and (C) illustrate a conventional multi-finger transistor in a top view, in B–B' cross-sectional view and in C—C' cross-sectional view, respectively. As shown in FIG. 1, the conventional multi-finger transistor 100 is formed on a P-substrate 10, including gates 110, N-doped source regions 120, N-doped drain regions 130, a field oxide layer 140 and drift regions 150. The P-substrate 10 further includes two pick-up regions 12 at two sides of the multi-finger transistor 100. A gate 110 is separated from the substrate 10 by a gate dielectric layer 108, and overlies a channel region 106. A source/drain region 120/130 is separated from the adjacent channel region 106 by the field oxide layer 140, and the drift regions 150 are located under the field oxide layer 140 between the source/drain region 120/130 and the gate 110. In addition, the dotted line in FIG. 1(A) represents the boundary of an opening in a mask layer for defining the drift regions 150.

FIG. 1(B) further depicts the parasitic NPN bipolar junction transistors (BJTs) in the multi-finger transistor 100, wherein each parasitic BJT is constituted of an N-doped drain region 130, an N-doped source region 120 and the P-substrate 10, which act as a collector electrode, an emitter electrode and a base electrode, respectively.

As shown in FIG. 1, since the central NMOS transistors are more distant from the pick-up regions 12, the base resistance ($R_{sub}$) of the corresponding parasitic BJT is higher. Meanwhile, since the breakdown voltages of all drain regions 130 are the same, the magnitude of the breakdown current from each drain region 130 to the substrate 10 is uniform. Therefore, when an ESD event occurs, the junction voltage between the collector (drain region 130) and the base (substrate 10) of the central parasitic BJTs is higher, so that the central parasitic BJTs are switched on first. The details of the above theory can be found in Hsu et al, "An Analytical Breakdown Model for Short-Channel MOSFET'S" IEEE Trans. Electron Device November 1982. Consequently, most of the ESD current will flow through the central NMOS, and contact spiking or junction punch easily occurs to the drain region thereof to significantly deteriorate the ESD protection function of the multi-finger transistor.

To solve the aforementioned problems, U.S. Pat. No. 5,831,316 discloses another multi-finger transistor structure, wherein the diffusion region for providing the well/substrate contact is distributed in the source region to make the base resistance value of the parasitic NPN (or PNP) transistor in each finger NMOS equal to each other. However, by distributing the well/substrate contacts in the source region, the lateral area of the multi-finger transistor is significantly increased to adversely affect the device miniaturization.

SUMMARY OF THE INVENTION

Accordingly, this invention provides a multi-finger transistor that includes a special drift region structure for simultaneously switching on all parasitic BJTs on an ESD event to prevent damage of the drain regions of the central transistors.

The multi-finger transistor of this invention includes multiple parallel transistors. Each transistor includes a gate dielectric layer and a gate on a substrate, a source/drain region in the substrate beside the gate, and a drift region in the peripheral substrate of the source/drain region separating the gate and the source/drain region. The width of the drift region extending from the side boundary of the source/drain region increases with the increase in the distance between the transistor and the pick-up region of the substrate. That is, when the pick-up regions are disposed at two sides of the multi-finger transistor substantially along the arrangement direction of the transistors, the extension width of the drift region increases stepwise from the edge portions of the multi-finger transistor toward the central portion of the same.

In the multi-finger transistor of this invention, a drain region accompanying with a drift region wider in the side direction has a higher breakdown voltage, so that the breakdown current from the drain region to the substrate is smaller. Therefore, the substrate currents from the drains of the transistors more distant from the pick-up region are smaller, thereby compensating the effect of the higher base resistance of the parasitic BJTs. Consequently, each parasitic BJT can be switched on at the same time to evenly share the ESD current, so that the ESD protection function of the multi-finger transistor can be assured. Moreover, since no additional substrate/well pick-up region is disposed in the multi-finger transistor of this invention, the lateral area of the multi-finger transistor is not increased in this invention.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 2(A), (B) and (C) illustrate a multi-finger transistor according to the preferred embodiment of this invention in a top view, in B–B' cross-sectional view and in C–C' cross-sectional view, respectively.

Figure 1:
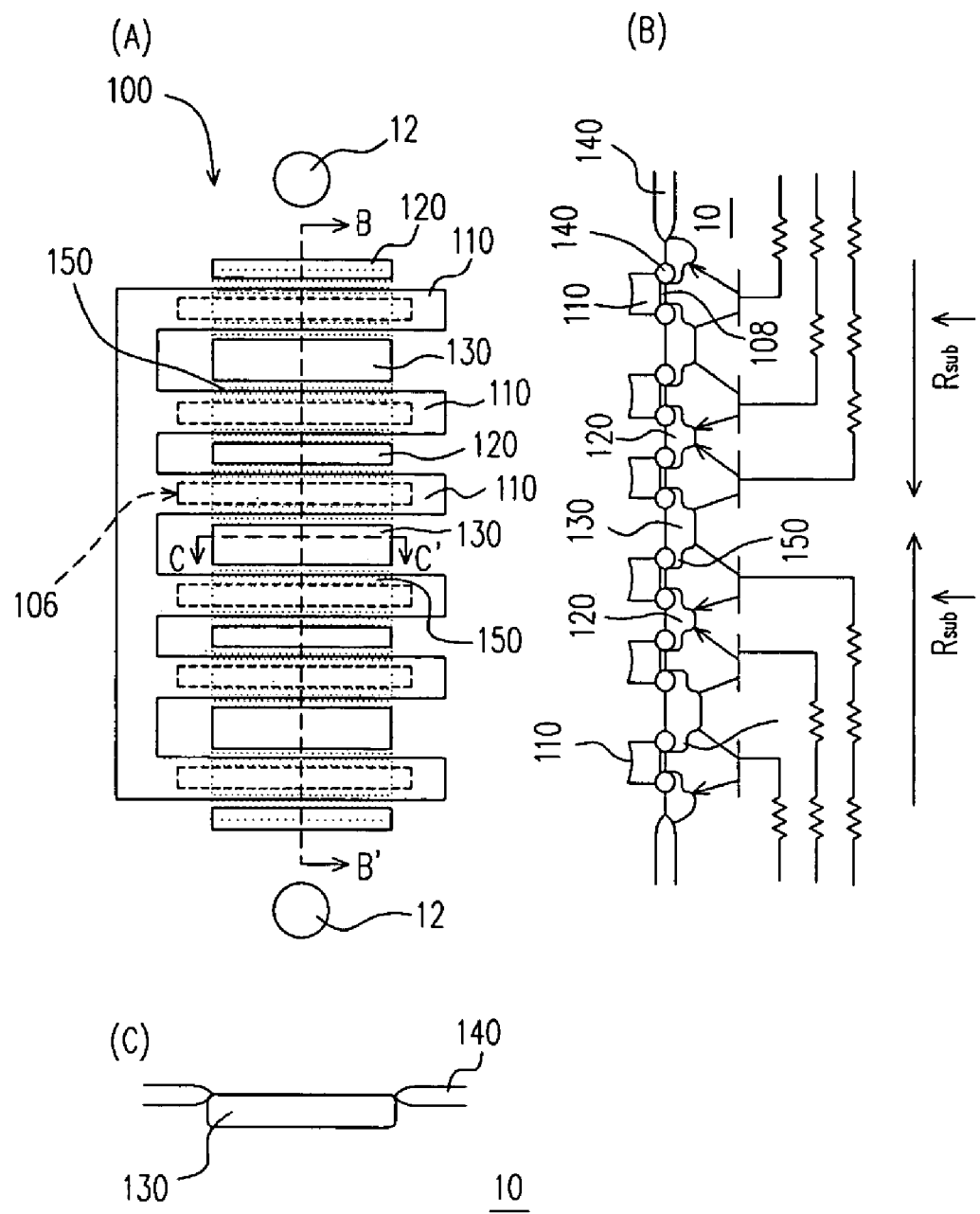
FIGS. 1(A), (B) and (C) illustrate a conventional multi-finger transistor in a top view, in B–B' cross-sectional view and in C–C' cross-sectional view, respectively.
Figure 2:
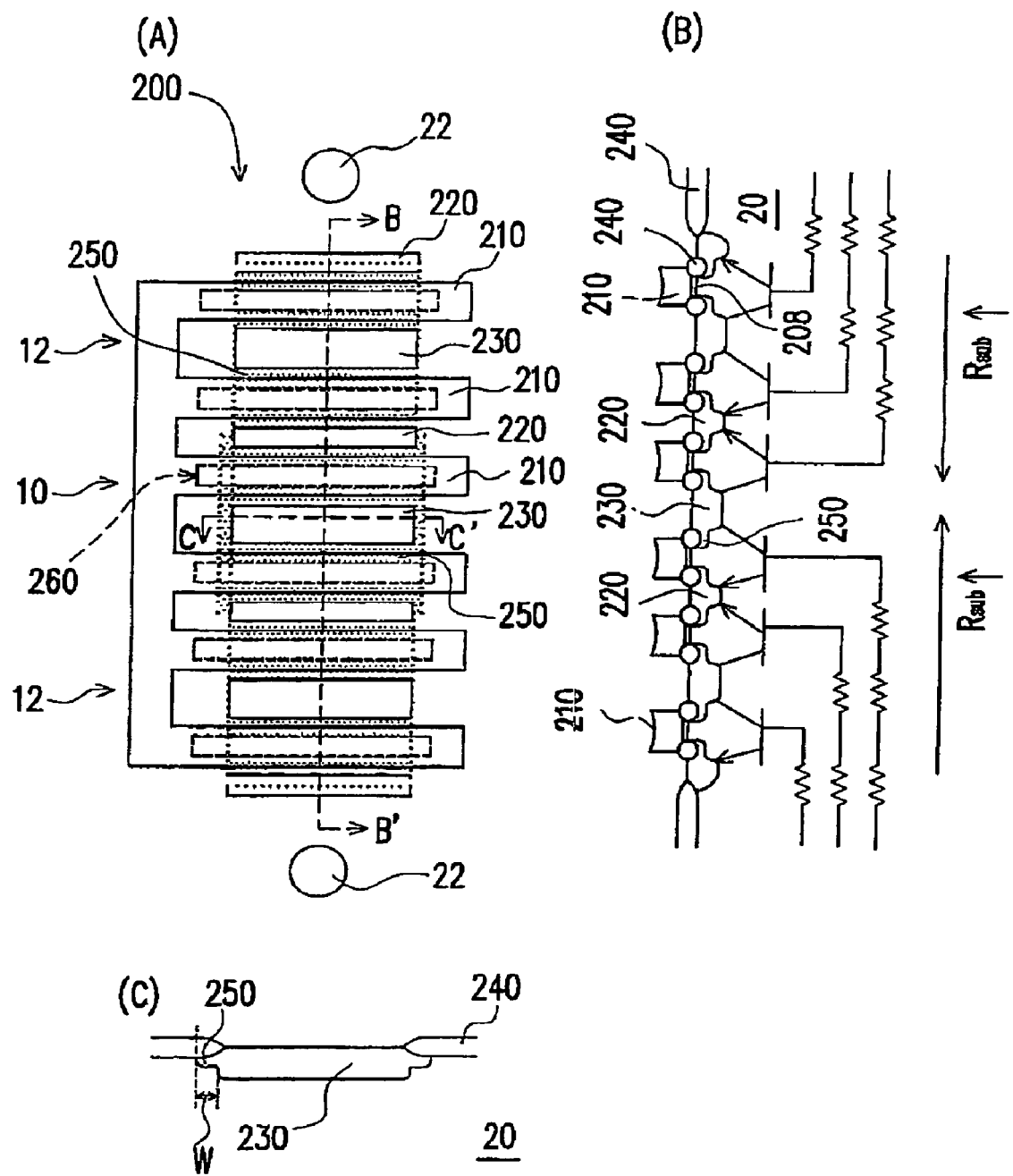
FIGS. 2(A), (B) and (C) illustrate a multi-finger transistor according to a preferred embodiment of this invention in a top view, in B–B' cross-sectional view and in C–C' cross-sectional view, respectively.

Referring to FIG. 2, the multi-finger transistor 200 is disposed on a P-well (or P-substrate) 20, including multiple parallel gates 210, N-doped source regions 220, N-doped drain regions 230, a field oxide layer 240 and drift regions 250. The P-well 20 further includes two pick-up regions 22 at two sides of the multi-finger transistor 200 along the arrangement direction of the parallel transistors. The gates 210 are connected to each other at the ends of the same side, and are separated from the P-well 20 by gate dielectric layers 208 overlying channel regions 260. The source regions 220 and the drain regions 230 are located in the P-well 20 between the parallel gates 210, and are arranged alternately in the P-well 20. A drain region 230 or a non-terminal source region 220 is shared by two NMOS transistors, and the width of each drain region 230 is larger than that of each source region 220, as shown in FIG. 2(B). Within the domain of the multi-finder transistor 200, the field oxide layer 240 covers all regions except the source/drain regions 220/230 and the channel regions 260, and therefore separates the source/drain regions 220/230 and the channel regions 260. The field oxide layer 240 is partially covered by the gates 210, and the drift regions 250 are located under the field oxide layer 240. In addition, the dotted line in FIG. 2(A) represents the boundary of an opening in a mask layer for defining the drift regions 250, which will be explained later.

Referring to FIG. 2 again, for an NMOS transistor in the two wing sections 12 of the multi-finder transistor 200, the drift region 250 thereof merely exists between the gate 210 and the source/drain region 220/230. For an NMOS transistor in the central section 10 however, the drift region 250 surrounds the drain region 230. In other words, in an NMOS transistor of the central section 10 the drift region 250 extends from the side boundary of the drain region 230 by a width "W", as shown in FIG. 2C. Since the drain region 230 in an NMOS transistor of the central section 10 is connected with the drift region 250 at two sides thereof, the curvature of junction depletion region of the drain region 230 can be reduced to result in a breakdown voltage higher than that of the drain region 230 of an NMOS transistor in the two wing sections 12.

FIG. 2(B) further depicts the parasitic NPN-BJTs in the multi-finger transistor 200, wherein each parasitic BJT is constituted of an N-doped drain region 230, an N-doped source region 220 and the P-well 20, which act as a collector electrode, an emitter electrode and a base electrode, respectively. Since the pick-up regions 22 are located at two sides of the multi-finger transistor 200, the base resistance of parasitic BJT increases toward the central section of the multi-finger transistor 200.

Figure 3:
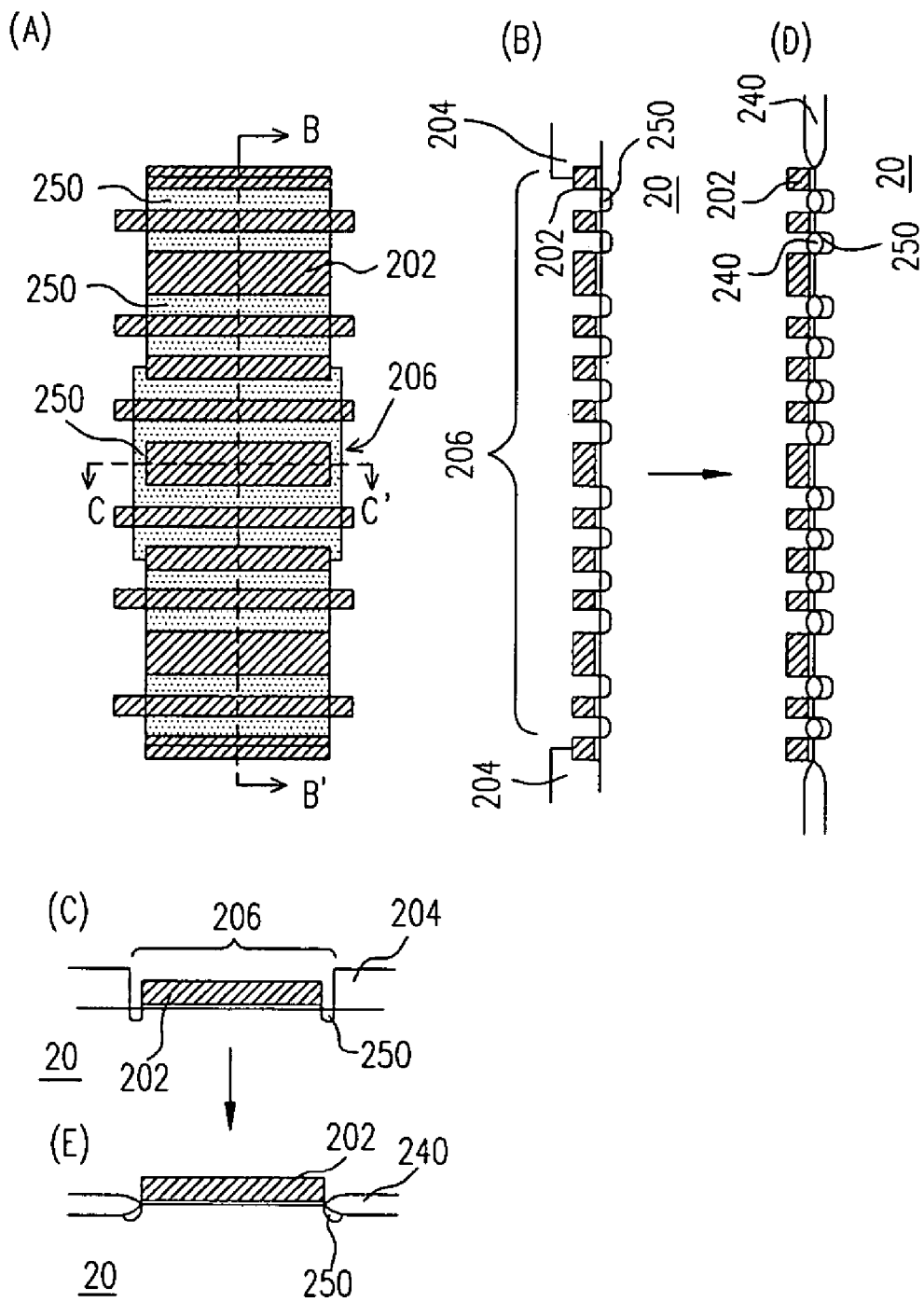
FIG. 3 illustrates an exemplary method for forming the drift regions of the multi-finger transistor shown in FIG. 2, wherein FIGS. 3(A), (B) and (C) show the top view, B–B' cross-sectional view and C–C' cross-sectional view, respectively, of the resulting structure after a first stage of the method, and FIGS. 3(D) and (E) show the resulting structure after a subsequent second stage of the method.

FIG. 3 illustrates an exemplary method for forming the drift regions of the multi-finger transistor shown in FIG. 2. FIGS. 3(A), (B) and (C) show the top view, B–B' cross-sectional view and C–C' cross-sectional view, respectively, of the resulting structure after a first stage of the method. FIGS. 3(D) and (E) show the resulting structure after a second stage of the method.

Referring to FIGS. 3(A)/(B)/(C), a patterned mask layer 202 is formed on the substrate 20, approximately covering the regions where the channel regions 206 and the source/drain regions 220/230 will be formed (see FIG. 2(A)). A patterned photoresist layer 204 having an opening 206 therein is then formed on the substrate 20, wherein the opening 206 has a wider central section and therefore can be divided into three sections. The width of each section corresponds to the extension width of the drift regions that will be formed at the same location. Thereafter, the mask layer 202 and the photoresist layer 204 are used as a mask to form drift regions 250 in the exposed substrate 20. The method for forming drift regions 250 includes, for example, an ion implantation process.

Referring to FIGS. 3(D)/(E), after the photoresist layer 204 is removed, a thermal oxidation process is performed to form a field oxide layer 240 on the portions of the substrate 20 not covered by the patterned mask layer 202. Thus the drift regions 250 are located under the field oxide layer 240.

Thereafter, subsequent processes are conducted to form the gate oxide layer, the gates and the source/drain regions, as shown in FIG. 2. The gate oxide layer 208 is formed with, for example, a wet thermal-oxidation process. The gates 210 are made from a conductive material, such as a polysilicon material formed with LPCVD.

In addition, when more transistors are included in a multi-finger transistor so that the difference of base resistance is further increased, the extension width of drift region can have more variations. Specifically, the multi-finger transistor can be divided into 2m+1 sections (m=1, 2 or other positive integer) along the arrangement direction of the constituting transistors. The extension width of drift region is smallest in the two outmost sections, and increases stepwise toward the central section of the multi-finger transistor.

Figure 4:
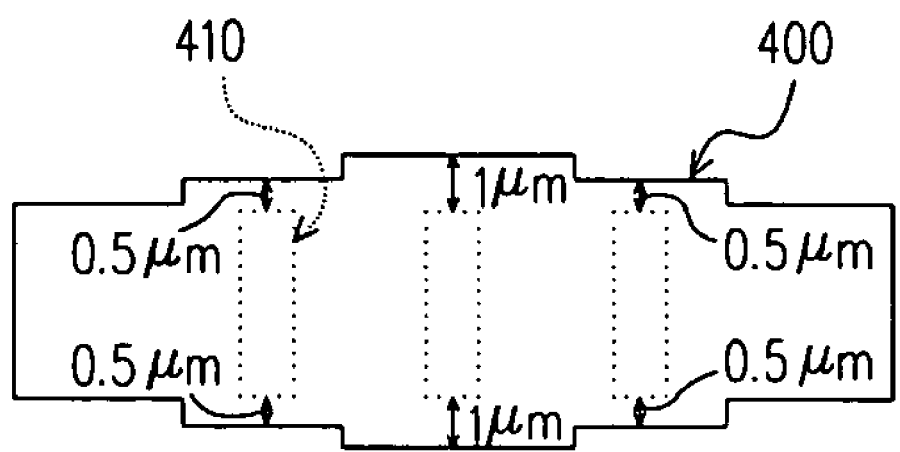
FIG. 4 illustrates another exemplary shape of an opening in a mask layer for defining drift regions according to the preferred embodiment of this invention.

When m is equal to 2, for example, the opening in a mask layer for defining drift regions may have a shape as shown in FIG. 4. In FIG. 4, the opening in a mask layer is labeled with "400", while the regions where drain regions will be formed are labeled with "410". The opening is divided into 5 sections (m=2), wherein the width of the two outmost sections corresponds to a drift region extension width of zero, and the section width increases toward the central section. That is, the width of the central section corresponds to the largest drift region extension width, such as 1.0 μm; the width of the two sections adjacent to the central section corresponds to a smaller drift region extension width, such as 0.5 μm.

As mentioned above, in the multi-finger transistor according to the preferred embodiment of this invention, a drain region accompanying with a wider drift region has a higher breakdown voltage, so that the breakdown current from the drain region to the substrate is smaller. Therefore, the substrate current from the drain of the central transistor is smaller, thereby compensating the effect of the larger base resistance of the corresponding parasitic BJT. Consequently, each parasitic BJT can be switched on at the same time to evenly share the ESD current, so that the ESD protection function of the multi-finger transistor can be assured. Moreover, since no additional substrate/well pick-up region is disposed in the multi-finger transistor of this invention, the lateral area of the multi-finger transistor is not increased in this invention.

According to the preferred embodiment of this invention, the extension width of drift region increases stepwise from the edge sections of the multi-finger transistor toward the central section of the same since the substrate/well pick-up region is located at two sides of the multi-finger transistor. Nevertheless, this invention can also be applied to the cases where the substrate/well pick-up region is not located at two sides of the multi-finger transistor, according to the principles of this invention. More specifically, by following the rule that the extension width of drift region increases with the increase in the distance between the transistor and the substrate/well pick-up region, the reduction of substrate current can compensate the increase in base resistance without respect to the location of the pick-up region. Thus each parasitic bipolar junction transistors can be switched on simultaneously to prevent the multi-finger transistor from being damaged.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A multi-finger transistor, comprising:
   a plurality of parallel gates on a substrate;
   a gate dielectric layer between the gates and the substrate;
   a plurality of source/drain regions, each source/drain region is formed in the substrate beside each gate, wherein a region in the substrate under each gate is a channel region; and
   a plurality of drift regions, each drift region is formed in the substrate between each channel region and each source/drain region, wherein
   the drift regions in a central section of the multi-finger transistor surround the corresponding source/drain regions, and a width from a side boundary of the source/drain region to a boundary of the drift region along a direction parallel to the gate increases stepwise from the edge sections of the multi-finger transistor toward the central section of the multi-finger transistor.

2. The multi-finger transistor of claim 1, wherein the multi-finger transistor is divided into 2m+1 sections along an arrangement direction of the parallel gates, wherein m is a positive integer, and the width is smallest in the outmost sections of the multi-finger transistor and increases therefrom toward the central section of the multi-finger transistor.

3. The multi-finger transistor of claim 2, wherein m is 1 or 2.

4. The multi-finger transistor of claim 2, wherein the width is zero in the outmost sections of the multi-finger transistor.

5. The multi-finger transistor of claim 1, further comprising an isolation layer above each drift region, and each gate partially covers the isolation layer.

6. The multi-finger transistor of claim 5, wherein the isolation layer comprises a field oxide layer.

7. The multi-finger transistor of claim 1, wherein the source or drain region beside one of the gate is connected with the source or drain region beside another gate.

8. The multi-finger transistor of claim 7, wherein a width of the drain region is larger than a width of the source region.

9. A multi-finger transistor, comprising:
   a plurality of parallel gates on a substrate, wherein the substrate further has a pick-up region thereon;
   a gate dielectric layer between the gates and the substrate;
   a plurality of source/drain realons each a source/drain region is formed in the substrate beside each gate, wherein a region in the substrate under each gate is a channel region; and
   a plurality of drift regions, each drift region is formed in the substrate between each channel region and each source/drain region,
   the drift regions in a central section of the multi-finger transistor surround the corresponding source/drain regions, and a width from a side boundary of the source/drain region to a boundary of the drift region along a direction parallel to the gate increases with an increase in a distance between each gate and the pick-up region.

10. The multi-finger transistor of claim 9, further comprising an isolation layer above each drift region and each gate partially covers the isolation layer.

11. The multi-finger transistor of claim 10, wherein the isolation layer comprises a field oxide layer.

12. The multi-finger transistor of claim 9, wherein the source or drain beside one of the gate is connected with the drain or source beside another gate.

13. The multi-finger transistor of claim 12, wherein a width of the drain region is larger than a width of the source region.

* * * * *